United States Patent [19]

Chen

[11] Patent Number: 5,081,380

[45] Date of Patent: Jan. 14, 1992

[54] TEMPERATURE SELF-COMPENSATED TIME DELAY CIRCUITS

[75] Inventor: Kou-Su Chen, Fremont, Calif.

[73] Assignee: Advanced Micro Devices, Inc., Sunnyvale, Calif.

[21] Appl. No.: 422,321

[22] Filed: Oct. 16, 1989

[51] Int. Cl.[5] .................. H03K 5/159; H03K 3/01; G05F 3/04; G05F 3/16
[52] U.S. Cl. ................. 307/591; 307/594; 307/597; 307/603; 307/605; 328/55; 328/66; 323/312; 323/315
[58] Field of Search ............. 307/591, 594, 597, 603, 307/605, 606, 451; 328/55, 66; 323/312, 315

[56] References Cited

U.S. PATENT DOCUMENTS 4,473,762 9/1984 Iwahashi et al. ............. 307/591
4,931,668 6/1990 Kikuda et al. ................ 307/451

Primary Examiner—John S. Heyman
Assistant Examiner—Trong Phan
Attorney, Agent, or Firm—Davis Chin

[57] ABSTRACT

A constant time delay circuit which is insensitive to variations in temperature and has no D.C. power disipation includes a temperature-insensitive reference current source (12) for dynamically charging and discharging a capacitive load (M5), a polysilicon resistor (16), and at least one time delay control circuit (14) to produce a constant time delay. In an alternate embodiment, there is provided a temperature self-compensated programmable delay circuit which includes electrically programmable resistor means (30) for adjusting the total resistance in a temperature-insensitive reference current source (12b). As a result, the amount of the reference current is controlled so as to obtain a desired delay time.

20 Claims, 2 Drawing Sheets

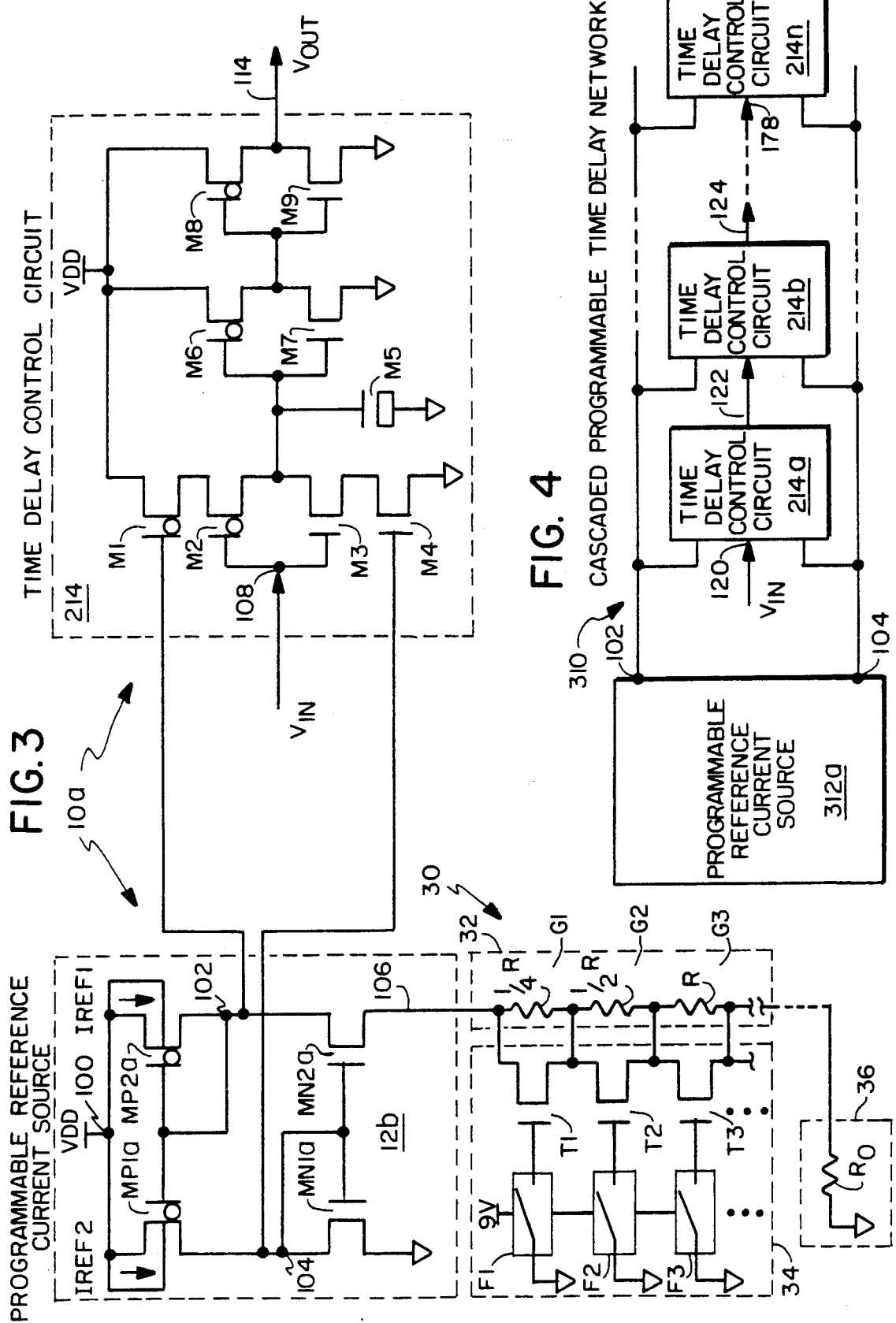

TEMPERATURE SELF-COMPENSATED TIME DELAY CIRCUITS

DESCRIPTION

Background of the Invention

This invention relates generally to electrical time delay circuits, and more particularly, it relates to a semiconductor integrated circuit comprising an integrated time delay circuit which is insensitive to temperature variations and consumes no D.C. power.

Heretofore, there are known in the prior art conventional delay line circuits formed of inductances, capacitances and resistances to control the desired time delay. Further, there also exists prior art delay line circuits of the type which utilize electronic circuitry such as inverters and logic circuits so as to control the time delay. However, all of these prior art delay line circuits suffer from the disadvantage of not being able to provide a high accuracy in the amount of time delay. In addition, such conventional delay lines do not have the capability of being programmable so as to allow users to vary or change the amount of time delay.

Moreover, another problem encountered in the prior art delay line circuits was that they all used a relatively high number of components which made them very complicated in their construction and thus not suitable for cascading purposes to achieve the desired delay functions and performance. Still another problem associated with these conventional delay line circuits was that the delay time was very sensitive to variations in temperature. Still yet another problem encountered was that of high power dissipations.

It would therefore be desirable to provide an integrated time delay circuit which is insensitive to temperature variations and consumes no D.C. power. Further, it would be expedient to provide a time delay circuit which has a delay time of high accuracy and high stability. In addition, it would be desirable to have the delay time capable of being easily reprogrammable by users.

SUMMARY OF THE INVENTION

Accordingly, it is a general object of the present invention to provide an improved integrated time delay circuit which is relatively simple and economical to manufacture and assemble, but yet overcomes the disadvantages of the prior art delay line circuits.

It is an object of the present invention to provide a constant time delay circuit which is insensitive to variations in temperature and has no D.C. power dissipation.

It is another object of the present invention to provide a constant time delay circuit which includes a temperature-insensitive reference current source for dynamically charging and discharging a capacitive load in order to produce a constant time delay.

It is still another object to provide a constant time delay circuit which includes a temperature-insensitive reference current and a polysilicon resistor whose resistance value is electrically erasable and programmable so as to adjust the amount of the reference current.

It is yet still another object of the present invention to provide a constant time delay circuit network which includes a temperature-insensitive reference current source and a plurality of cascaded time delay control circuits to provide a desired total delay time.

It is still yet another object of the present invention to provide a self-compensated temperature-insensitive reference current source formed of P-type and N-type MOS transistors and a polysilicon resistor whose resistance value is electrically erasable and programmable, thereby compensating for process variations over the operating temperature range.

In accordance with these aims and objectives, the present invention is concerned with the provision of a temperature self-compensated constant delay circuit which includes a reference current source, a polysilicon resistor, and at least one time delay control circuit. The reference current source includes a pair of first and second N-channel transistors and a current mirror arrangement formed of first and second P-channel transistors. The gates of the first and second N-channel transistors are connected together and to the drain of the first N-channel transistor. The first N-channel transistor has its drain connected to a first node and its source connected to a ground potential. The second N-channel transistor has its drain connected to a second node and its source connected to a third node. The gates of the first and second P-channel transistors are connected together and to the drain of the second P-channel transistor. The first P-channel transistor has its source connected to a supply potential and its drain connected to the first node. The second P-channel transistor has its source also connected to the supply potential and its drain connected to the second node. The polysilicon resistor has its one end connected to the third node and its other end connected to the ground potential.

The time delay control circuit includes a P-channel MOS current-sourcing transistor, a first switching transistor, a second switching transistor, and an N-channel MOS current-sinking transistor. The current-sourcing transistor has its source connected to the supply potential, its gate connected to the second node and its drain connected to the source of the first switching transistor. The current-sinking transistor has its drain connected to the source of the second switching transistor, its gate connected to the first node, and its source connected to the ground potential. The gates of the first and second switching transistors are connected together and to an input terminal for receiving an input logic signal. The drains of the first and second switching transistors are connected together and to a fourth node. The time delay control circuit further includes capacitive load means coupled between the fourth node and the ground potential. The capacitive load means is charged by the current-sourcing transistor whose current is mirrored from a first reference current and is discharged by the current-sinking transistor whose current is mirrored from a second reference current to produce a constant delay time at the fourth node.

In another aspect of the present invention, there is provided a temperature self-compensated programmable delay circuit which is formed of a reference current source, an electrically programmable resistor means, and at least one time delay control circuit. The programmable resistor means is coupled to the reference current source for adjusting the total resistance value.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 3 is a schematic circuit diagram of a second embodiment of a temperature self-compensated delay circuit of the present invention which is electrically erasable and programmable so as to adjust the reference current to obtain the desired delay time; and FIG. 4 is a block diagram of a cascaded programmable delay network of the present invention, utilizing a plurality of time delay control circuits of FIG. 3, to provide a desired total delay time.

DESCRIPTION OF THE PREFERRED EMBODIMENTS

Figure 1:
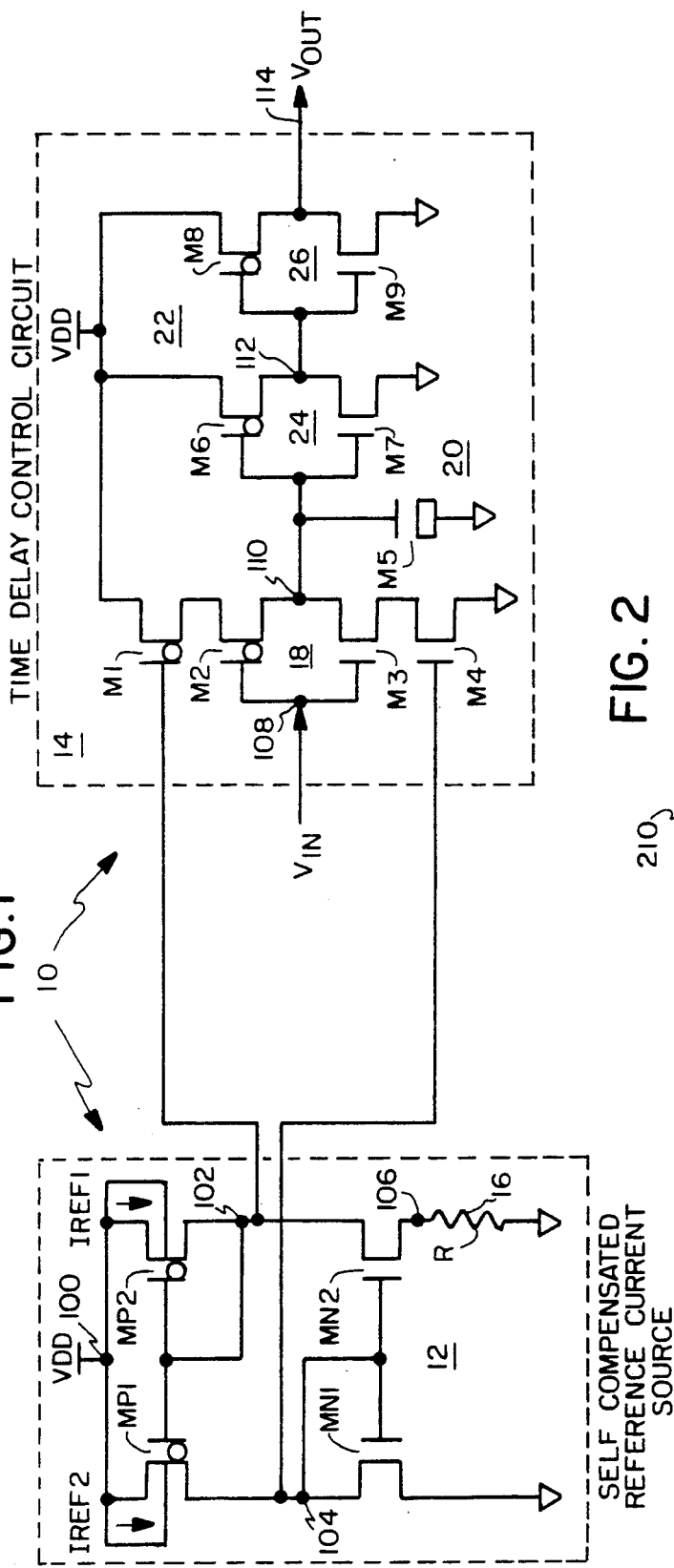
FIG. 1 is a schematic circuit diagram of a temperature self-compensated constant delay circuit, constructed in accordance with the principles of the present invention.

Referring now in detail to the drawings, there is shown in FIG. 1 a schematic circuit diagram of a temperature self-compensated constant delay circuit 10 of the present invention. The constant delay circuit 10 is comprised of a reference current source 12 and a time delay control circuit 14. The reference current source 12 provides reference currents IREF1 and IREF2 which are insensitive to variations over a wide temperature range. The reference currents from the current source 12 are used for accurately charging and discharging a capacitive load formed of a MOS transistor in the control circuit 14 to obtain a desired constant time delay.

The reference current source 12 includes a pair of first and second N-channel MOS transistors MN1, MN2, and a current mirror arrangement formed of first and second P-channel MOS transistors MP1, MP2. The gates of the first and second N-channel transistors MN1 and MN2 are connected together and to the drain of the first N-channel transistor MN1. The drain of the first transistor MN1 is also tied to a node 104, and the drain of the second transistor MN2 is tied to a node 102. The source of the first transistor MN1 is connected to a ground potential, and the source of the second transistor MN2 is connected to a node 106. One end of a polysilicon resistor 16 having a value R is also connected to the source of the second transistor MN2, and the other end of the resistor 16 is connected to the ground potential.

The gates of the first and second P-channel transistors MP1 and MP2 are connected together and to the drain of the second P-channel transistor MP2. The drain of the second transistor MP2 is also connected to the node 102. The drain of the first transistor MP1 is also connected to the node 104. The sources of the transistors MP1 and MP2 are connected together and to a supply voltage or potential VDD at a node 100. The supply potential VDD is typically at +5.0 volts.

As is generally known, the value of the polysilicon resistor 16 increases with temperature because it has a positive temperature-coefficient while the MOS transistor current decreases with temperature due to its reduction in mobility of the charge carriers. Thus, the MOS transistor current has a negative temperature-coefficient. Accordingly, when the temperature rises the gate voltage of the transistors MN1 and MN2 at the node 104 will increase since the value of the polysilicon resistor 16 increases with temperature. However, with a higher gate voltage being at the node 104 the N-channel transistor MN2 will be caused to conduct more current. This will, in turn, cause the gate voltages on the P-channel transistors MP1 and MP2 at the node 102 to decrease with higher temperatures so as to allow for more current to flow therethrough.

While the current flowing through the polysilicon resistor 16 has a positive temperature coefficient, this is compensated for by the current flowing through the MOS transistor MN2 which has a negative temperature coefficient. As a result, the reference current IREF1 flowing through the P-channel transistor MP2 is a stable current which is insensitive to variations in temperature. The MOS transistors are designed to operate in the saturation region and are closely laid out so that the pairs of transistors MP1, MP2 and MN1, MN2 have matched geometries, thereby minimizing parameter differences due to process variations. By proper sizing, the reference current IREF2 flowing through the transistor MP1 will be made equal to the reference current IREF1 flowing through the transistor MP2.

The time delay control circuit 14 includes an input stage 18, timing means 20, and an output stage 22. The input stage 18 consists of a series connection of a P-channel MOS current-sourcing transistor M1, a first switching transistor M2, a second switching transistor M3, and an N-channel current-sinking transistor M4. The current-sourcing transistor M1 has its source connected to the supply potential VDD, its gate connected to the node 102, and its drain connected to the source of the first switching transistor M2. The gates of the first and second switching transistors M2 and M3 are connected together and to an input terminal 108 for receiving an input logic signal VIN swinging between 0 volts and +5 volts. The drains of the first and second switching transistors M2 and M3 are connected together and to a node 110. The current-sinking transistor M4 has its drain connected to the source of the second switching transistor M3, its gate connected to the node 104 and its source connected to the ground potential.

The transistors M1 and MP2 function as a second current mirror arrangement so that the current flowing through the transistor M1 will be equal to the reference current IREF1 flowing through the transistor MP2. Similarly, the transistors M4 and MN1 function as a third current mirror arrangement so that the current flowing through the transistor M4 will be equal to the reference current IREF2 flowing through the transistor MP1.

The timing means 20 includes a capacitive load formed of a MOS transistor M5 and other capacitances associated with the node 110. As it known, the silicon gate oxide of a MOS transistor can be used to form a capacitor by using the gate electrode of the MOS transistor as one capacitor plate and tying the drain and source electrodes together to form the other capacitor plate. As can be seen, one plate of the capacitor is connected to the node 110, and the other plate of the capacitor is connected to the ground potential.

The output stage 22 is comprised of first and second inverters 24 and 26. The input of the first inverter 24 is connected also to the node 110, and the output thereof is connected to a node 112. The input of the second inverter 26 is connected to the output of the first inverter at the node 112. The output of the second inverter 26 is connected to an output terminal 114. The first inverter is formed of a P-channel MOS transistor M6 and an N-channel MOS transistor M7. The gates of the transistors M6 and M7 are connected together defining the input of the first inverter 24. The gate capacitances of the transistors M6 and M7 thus correspond to the capacitances associated with the node 110. The drains of the transistors M6 and M7 are connected together defining the output of the first inverter 24.

The second inverter is formed of a P-channel MOS transistor M8 and an N-channel MOS transistor M9. The gates of the transistors M8 and M9 are connected together defining the input of the second inverter 26. The drains of the transistors M8 and M9 are connected together defining the output of the second inverter 26, which is the output of the time delay control circuit 14. The sources of the transistors M6 and M8 are connected to the supply potential VDD and the sources of the transistors M7 and M9 are connected to the ground potential. The output stage 22 serves to provide high drive capability and wave-shaping of the time delayed signal at the node 110. Thus, there is provided at the output terminal 114 an output signal having a desired time delay.

The operation of the constant delay circuit 10 will now be described. Assume that the input signal VIN is at a low logic level. This will render the first switching transistor M2 to be conductive and the second switching transistor M3 to be non-conductive. As a result, the current corresponding to the reference current IREF1 flowing through the current-sourcing transistor M1 will also pass through the first switching transistor M2 for dynamically charging up the capacitive load M5. When the input signal VIN makes a transition to a high logic level, this will cause the first switching transistor M2 to be turned off and the second switching transistor M3 to be turned on. Therefore, the current corresponding to the reference current IREF2 flowing through the transistor M4 will also pass through the current-sinking transistor M3 for dynamically discharging the capacitive load M5. In this manner, time delay produced at the node 110 is dependent only upon the amount of reference currents and the amount of the capacitive load.

The time delayed signal at the node 110 will be inverted twice by the first and second inverters 24, 26 so as to provide the output signal on the output terminal 114, which is similar to the time delayed signal but with high drive capability. The MOS transistors M6-M9 are designed so as to provide minimal delays between the time delayed signal at the node 110 and the output signal on the output terminal 114.

Figure 2:
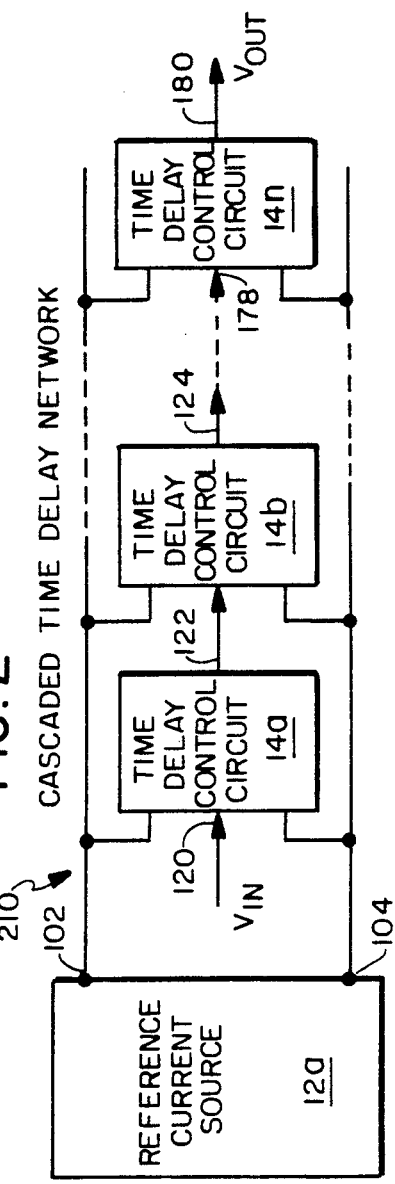
FIG. 2 is a block diagram of a cascaded delay network of the present invention, utilizing a plurality of time delay control circuits of FIG. 1, to provide a desired total delay time.

In FIG. 2, there is illustrated in block diagram form a cascaded time delay network 210. The delay network 210 is comprised of a reference current source 12a and a plurality of time delay control circuits 14a...14n which are cascaded together. Since each of the control circuits 14a...14n is identical to the control circuit 14 of FIG. 1, the desired total time delay at the output terminal 180 may be obtained by simply adjusting the reference current source of FIG. 1 by changing the resistance value of the resistor 16 to provide the amount of current needed for the reference current source 12a.

In FIG. 3, there is shown a schematic circuit diagram of a temperature self-compensated programmable time delay circuit 10a of the present invention which is electrically erasable and programmable so as to adjust the reference currents to obtain the desired delay time. The programmable delay circuit 10a is substantially identical to the temperature self-compensated constant delay circuit 10 of FIG. 1, except that the polysilicon resistor 16 of a fixed value R in the reference current source 12 has been replaced with an electrically programmable resistor means 30 formed of a resistance ladder network 32 and programming means 34 for varying the amount of resistance in the resistance ladder network 32. Therefore, the components and operation of FIG. 3 will be described only with respect to these changes.

As can be seen, the temperature self-compensated programmable delay circuit 10a includes a reference current source 12b and a time delay control circuit 214. The time delay control circuit 214 is identical to the control circuit 14 of FIG. 1. The reference current source 12b includes a pair of N-channel MOS transistors MN1a, MN2a, and a current mirror arrangement formed of P-channel transistors MP1a, MP2a which are interconnected in a similar manner to FIG. 1. The reference current source 12b further includes the electrically programmable resistor means 30 formed of the resistance ladder network 32 and the programming means 34 for varying the amount of resistance in the resistance ladder network 32.

The resistance ladder network 32 is comprised of a fixed section and an adjustable section. The fixed section includes a fixed resistor 36 having a resistance value of $R_0$. The adjustable section includes a series connection of a plurality of resistors G1, G2, G3... having different resistance values such as $\frac{1}{4}$ R, $\frac{1}{2}$ R and 1 R respectively. One end of the fixed resistor 36 is connected to one end of the series connection of resistors, and the other end of the fixed resistor 36 is connected to a ground potential GND. The other end of the series connection is connected to the source of the N-channel transistor MN2a at the node 106.

The programming means 34 includes a plurality of N-channel MOS programming transistors T1, T2, T3... and a plurality of electrically erasable and programmable fuses F1, F2, F3.... Each of the programming transistors T1, T2, T3... has its conduction path electrodes (drain-source) connected in parallel with a corresponding one of the resistors G1, G2, G3.... The gate electrodes of each of the programming transistors T1, T2, T3... is connected to a corresponding one of the programming fuses F1, F2, F3.... When the electrical erasable and programmable fuses are closed, a supply voltage VCC of +9.0 volts is applied to the gate electrodes of the corresponding programming transistors. This will cause the corresponding programming transistor to be turned on, thereby "shorting" the corresponding resistor connected in parallel therewith. When the electrically erasable and programmable fuses are opened as illustrated in FIG. 3, a ground potential is applied to the gate electrodes of the corresponding programming transistors. This will in turn cause the corresponding programming transistors to be turned off, thereby increasing the resistance value of the adjustable section.

Accordingly, in this manner the total resistance in the adjustable section can be determined by controlling selectively the closing and opening of desired ones of electrically erasable and programmable fuses. It will be understood to those skilled in the art that any number of resistors could have been used in the adjustable section with like corresponding numbers of programming transistors and fuses. When the total resistance values between the node 106 and the ground potential decreases, the reference currents will increase and vice versa. However, these reference currents again will be insensitive to variations in temperature. Therefore, the time delay generated from the control circuit 214 will likewise be temperature-insensitive.

In FIG. 4, there is depicted in block diagram form a cascaded programmable delay network 310. The delay network 310 is comprised of a reference current source 312a and a plurality of time delay control circuits 214a...214n. Since the reference current source 312a is identical to the reference current source 12b and each of the control circuits 214a...214n is identical to the control circuit 214, the desired total time delay at the output terminal 180 may be programmable by adjusting the value of the total resistance of FIG. 3 to provide the amount of current needed for the current source 312a.

From the foregoing detailed description, it can thus be seen that the present invention provides an improved temperature self-compensated constant delay circuit which is insensitive to variations in temperature and has no D.C. power dissipation. Further, there is provided in an alternate embodiment a temperature self-compensated programmable delay circuit which includes electrically programmable resistor means for adjusting the total resistance value.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A temperature self-compensated constant time delay circuit comprising:

reference current source means (12) for generating a first stable reference current (IREF1) at a first node (102) and a second stable reference current (IREF2) at a second node (104) which are insensitive to variations in temperature over a wide range;

said reference current source means (12) including a pair of first and second N-channel transistors (MN1, MN2) and a current mirror arrangement formed of first and second P-channel transistors (MP1, MP2), the gates of said first and second N-channel transistors (MN1, MN2) being connected together and to the drain of said first N-channel transistor (MN1), said first N-channel transistor (MN1) having its drain connected to the second node (104) and its source connected to a ground potential, said second N-channel transistor (MN2) having its drain connected to the first node (102) and its source connected to a third node (106);

the gates of said first and second P-channel transistors (MP1, MP2) being connected together and to the drain of the second P-channel transistor (MP2), said first P-channel transistor (MP1) having its source connected to a supply potential and its drain connected to the second node (104), said second P-channel transistor (MP2) having its source also connected to the supply potential and its drain connected to the first node (102);

a polysilicon resistor (16) having its one end connected to the third node (106) and its other end connected to the ground potential;

at least one time delay control circuit (14) including a P-channel MOS current-sourcing transistor (M1), a first switching transistor (M2), a second switching transistor (M3) and an N-channel MOS current-sinking transistor (M4), said current-sourcing transistor (M1) having its source connected to the supply potential, its gate connected to the first node (102) and its drain connected to the source of said first switching transistor (M2), said current-sinking transistor (M4) having its drain connected to the source of said second switching transistor (M3), its gate connected to the second node (104), and its source connected to the ground potential, the gates of said first and second switching transistors (M2, M3) being connected together and to an input terminal for receiving an input logic signal (VIN), the drains of said first and second switching transistors (M2, M3) being connected together and to a fourth node (110);

said P-channel MOS current-sourcing transistor (M1) and said second P-channel transistor (MP2) defining a second current mirror arrangement so that the current flowing through said P-channel current-sourcing transistor (M1) will be equal to said first reference current (IREF1);

said N-channel MOS current-sinking transistor (M4) and said first N-channel transistor (MN1) defining a third current mirror arrangement so that the current flowing through said N-channel current-sinking transistor (M4) will be equal to said second reference current (IREF2); and said time delay control circuit (14) further including capacitive load means (M5) coupled between said fourth node (110) and the ground potential, said capacitive load means being charged by said first reference current from said first node and being discharged by said first reference current from said second node to produce a constant delay time at said fourth node (110).

2. A temperature self-compensated constant time delay circuit as claimed in claim 1, further comprising output stage means (22) coupled to said fourth node for producing high drive capability and wave-shaping of a time delay signal at said fourth node.

3. A temperature self-compensated constant time delay circuit as claimed in claim 2, wherein said output stage means (22) comprises first and second inverters (24, 26), said first inverter (24) having its input coupled to the fourth node (110) and its output coupled to the input of said second inverter (26), said second inverter (26) having an output defining the output of said time delay control circuit (14).

4. A temperature self-compensated constant time delay circuit as claimed in claim 3, wherein each of said first and second inverters (24, 26) is comprised of a P-channel MOS transistor and an N-channel MOS transistor whose gates are connected together to define its input and whose drains are connected together to define its output.

5. A temperature self-compensated constant time delay circuit as claimed in claim 1, wherein said capacitive load means comprises a MOS transistor (M5) having its gate electrode forming one capacitor plate and its drain and source electrodes connected together to form the other capacitor plate.

6. A temperature self-compensated programmable time delay circuit comprising:

reference current source means (12) for generating a first stable reference current (IREF1) at a first node (102) and a second stable reference current (IREF2) at a second node (104) which are insensitive to variations in temperature over a wide range;

said reference current source means (12) including a pair of first and second N-channel transistors (MN1, MN2) and a current mirror arrangement formed of first and second P-channel transistors (MP1, MP2), the gates of said first and second N-channel transistors (MN1, MN2) being connected together and to the drain of said first N-channel transistor (MN1), said first N-channel transistor (MN1) having its drain connected to the second node (104) and its source connected to a ground potential, said second N-channel transistor (MN2) having its drain connected to the first node (102) and its source connected to a third node (106);

the gates of said first and second P-channel transistors (MP1, MP2) being connected together and to the drain of the second P-channel transistor (MP2), said first P-channel transistor (MP1) having its source connected to a supply potential and its drain connected to the second node (104), said second P-channel transistor (MP2) having its source also connected to the supply potential and its drain connected to the first node (102);

electrically programmable resistor means (30) coupled between said third node (106) and the ground potential for adjusting the total resistance value;

at least one time delay control circuit (14) including a P-channel MOS current-sourcing transistor (M1), a first switching transistor (M2), a second switching transistor (M3) and an N-channel MOS current-sinking transistor (M4), said current-sourcing transistor (M1) having its source connected to the supply potential, its gate connected to the first node (102) and its drain connected to the source of said first switching transistor (M2), said current-sinking transistor (M4) having its drain connected to the source of said second switching transistor (M3), its gate connected to the second node (104), and its source connected to the ground potential, the gates of said first and second switching transistors (M2, M3) being connected together and to an input terminal for receiving an input logic signal (VIN), the drains of said first and second switching transistors (M2, M3) being connected together and to a fourth node (110);

said P-channel MOS current-sourcing transistor (M1) and said second P-channel transistor (MP2) defining a second current mirror arrangement so that the current flowing through said P-channel current-sourcing transistor (M1) will be equal to said first reference current (IREF1);

said N-channel MOS current-sinking transistor (M4) and said first N-channel transistor (MN1) defining a third current mirror arrangement so that the current flowing through said N-channel current-sinking transistor (M4) will be equal to said second reference current (IREF2); and said time delay control circuit (14) further including capacitive load means (M5) coupled between said fourth node (110) and the ground potential, said capacitive load means being charged by said first reference current from said first node and being discharged by said second reference current from said second node to produce a constant delay time at said fourth node (110).

7. A temperature self-compensated programmable time delay circuit as claimed in claim 6, wherein said programmable resistor means (30) comprises resistance network means (32), programming transistor means and electrically erasable and programmable fuse means for controlling the amount of resistance coupled to said third node.

8. A temperature self-compensated programmable time delay circuit as claimed in claim 7, wherein said resistance network means (32) is comprised of a fixed section having a fixed resistor (36) and an adjustable resistor ladder section having a series-connection of a plurality of resistors (G1, G2, G3 . . . ) with different values, the amount of resistance in said adjustable section being determined by said fuse means to render conduction or non-conduction of said programming transistor means.

9. A temperature self-compensated programmable time delay circuit as claimed in claim 8, wherein said programming transistor means is comprised of a plurality of MOS transistors (T1, T2, T3 . . . ) whose conduction-path electrodes are connected in parallel with a corresponding one of the plurality of resistors (G1, G2, G3 . . . ), the gate electrodes of said MOS transistors being responsive to said fuse means.

10. A temperature self-compensated programmable time delay circuit as claimed in claim 9, wherein said fuse means comprises a plurality of electrically erasable and programmable fuses (F1, F2, F3 . . . ), certain ones of said fuses being selectively opened or closed to render the conduction or non-conduction of each of said programming transistors (T1, T2, T3 . . . ).

11. A temperature self-compensated programmable time delay circuit as claimed in claim 10, wherein the total resistance value is increased when each of said programming transistors is being rendered non-conductive.

12. A temperature self-compensated programmable time delay circuit as claimed in claim 6, further comprising output stage means (22) coupled to said fourth node for producing high drive capability and wave-shaping of a time delay signal at said fourth node.

13. A temperature self-compensated programmable time delay circuit as claimed in claim 12, wherein said output stage means (22) comprises first and second inverters (24, 26), said first inverter (24) having its input coupled to the fourth node (110) and its output coupled to the input of said second inverter (26), said second inverter (26) having an output defining the output of said time delay control circuit (14).

14. A temperature self-compensated programmable time delay circuit as claimed in claim 13, wherein each of said first and second inverters (24, 26) is comprised of a P-channel MOS transistor and an N-channel MOS transistor whose gates are connected together to define its input and whose drains are connected together to define its output.

15. A temperature self-compensated programmable time delay circuit as claimed in claim 6, wherein said capacitive load means comprises a MOS transistor (M5) having its gate electrode forming one capacitor plate and its drain and source electrodes connected together to form the other capacitor plate.

16. An electrically programmable reference current source for generating a first stable reference current (IREF1) at a first node and a second stable reference current (IREF2) at a second node which are insensitive to variations in temperature over a wide range, said reference current source comprising:
 a pair of first and second N-channel transistors (MN1, MN2);
 a current mirror arrangement formed of first and second P-channel transistors (MP1, MP2);
 the gates of said first and second N-channel transistors (MN1, MN2) being connected together and to the drain of said first N-channel transistor (MN1), said first N-channel transistor (MN1) having its drain connected to the second node (104) and its source connected to the ground potential, said second N-channel transistor (MN2) having its drain connected to the first node (102) and its source connected to a third node (106);
 the gates of said first and second P-channel transistors (MP1, MP2) being connected together and to the drain of the second P-channel transistor (MP2), said first P-channel transistor (MP1) having its source connected to a supply potential and its drain connected to the first node (104), said first P-channel transistor (MP2) having its source also connected to the supply potential and its drain connected to the first node (102); and
 electrically programmable resistor means (30) coupled between said third node (106) and the ground potential for adjusting the total resistance value.

17. An electrically programmable reference current source as claimed in claim 16, wherein said programmable resistor means (30) comprises resistance network means (32), programming transistor means and electrically erasable and programmable fuse means for controlling the amount of resistance coupled to said third node.

18. An electrically programmable reference current source as claimed in claim 17, wherein said resistance network means (32) is comprised of a fixed section having a fixed resistor (36) and an adjustable resistor ladder section having a series-connection of a plurality of resistors (G1, G2, G3 . . . ) with different values, the amount of resistance in said adjustable section being determined by said fuse means to render conduction or non-conduction of said programming transistor means.

19. An electrically programmable reference current source as claimed in claim 18, wherein said programming transistor means is comprised of a plurality of MOS transistors (T1, T2, T3 . . . ) whose conduction-path electrodes are connected in parallel with a corresponding one of the plurality of resistors (G1, G2, G3 . . . ), the gate electrodes of said MOS transistors being responsive to said fuse means.

20. An electrically programmable reference current source as claimed in claim 19, wherein said fuse means comprises a plurality of electrically erasable and programmable fuses (F1, F2, F3 . . . ), certain ones of said fuses being selectively opened or closed to render the conduction or nonconduction of each of said programming transistors (T1, T2, T3 . . . ).

* * * * *